(12) United States Patent
Megaw

(10) Patent No.: US 7,019,590 B1
(45) Date of Patent: Mar. 28, 2006

(54) SELF-STABILIZING DIFFERENTIAL LOAD CIRCUIT WITH WELL CONTROLLED IMPEDANCE

(75) Inventor: David J. Megaw, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 30 days.

(21) Appl. No.: 10/944,930

(22) Filed: Sep. 20, 2004

(51) Int. Cl.
 *H03F 3/45* (2006.01)
(52) U.S. Cl. ..................... 330/253; 330/257
(58) Field of Classification Search .............. 330/253, 330/257
See application file for complete search history.

(56) References Cited

U.S. PATENT DOCUMENTS 5,764,086 A * 6/1998 Nagamatsu et al. .......... 327/65
5,854,574 A * 12/1998 Singer et al. ................ 330/293
5,994,939 A * 11/1999 Johnson et al. ............. 327/280
6,476,656 B1 * 11/2002 Dally et al. ................. 327/276
6,650,182 B1 * 11/2003 Kim et al. ................... 330/252

* cited by examiner

*Primary Examiner*—Patricia Nguyen
(74) *Attorney, Agent, or Firm*—Darby & Darby PC; John W. Branch

(57) ABSTRACT

A circuit for providing a self-stabilizing, differential load circuit with well controlled impedance to an amplifier is described. According to one embodiment, two pairs of transistors in a cross-coupled configuration and a degeneration resistor for each transistor provide the self-stabilizing, differential load. Small signal analysis of the circuit illustrates an impedance of the load circuit to be substantially equal to a combination of resistor values with substantially little dependence on transconductances and incremental resistances of the transistors. By employing well matched resistors, impedance of the load to the amplifier may be well controlled, and common mode feedback loops avoided, because a current source is not employed as a load. Furthermore, due to use of transistors, a low voltage headroom may be increased and an integrated circuit area decreased.

20 Claims, 6 Drawing Sheets

SELF-STABILIZING DIFFERENTIAL LOAD CIRCUIT WITH WELL CONTROLLED IMPEDANCE

FIELD OF THE INVENTION

The present invention relates to amplifiers, and in particular, to a method and circuit for providing a self-stabilizing, differential load circuit with well controlled impedance to an amplifier.

BACKGROUND

A wide variety of electronic circuit applications employ differential measurement of two currents and some prescribed amount of rejection of common mode components of the currents. In some applications, the currents being measured may exist in a high DC voltage/current environment, while their information content is ultimately employed in a low voltage/current environment, with demanding requirements for accurate amplification and filtering. As a non-limiting example, various equipment employed by telecommunication service providers utilize subscriber line interface circuits (SLICs) to interface telecommunication signals with phone line wiring that may include substantial DC components.

As another example, fully balanced or differential transimpedance amplifiers may be employed in optical receiver systems, where a current-varying output signal of a photodetector is converted into a voltage signal to be processed by other circuitry. While amplifiers with a balanced load may provide a preferred solution for applications such as those listed above, other considerations such as component count, current dissipation, and the like may result in employment of hybrid circuits.

An amplifier with a balanced differential load may provide significantly improved noise immunity compared to a single-ended amplifier or an amplifier with an unbalanced load such as a current mirror.

Thus, it is with respect to these considerations and others that the present invention has been made.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment or an embodiment combining software and hardware aspects. The following detailed description is, therefore, not to be taken in a limiting sense.

Briefly stated, the present invention is directed to a circuit for providing a self-stabilizing, differential load circuit with well controlled impedance to an amplifier.

According to one embodiment, two pairs of transistors in a specific cross-coupled configuration and a degeneration resistor for each transistor provide the self-stabilizing, differential load. Small signal analysis of the circuit illustrates an impedance of the load circuit to be substantially equal to a combination of resistor values with substantially little dependence on transconductances and incremental resistances of the transistors.

By employing well matched resistors, impedance of the load to the amplifier may be well controlled, and a separate amplifier for a common mode feedback loop avoided, because a current source is not employed as a load. Furthermore, the use of transistors may enable increased low voltage headroom and decreased integrated circuit area compared to purely resistive loads.

Figure 1:
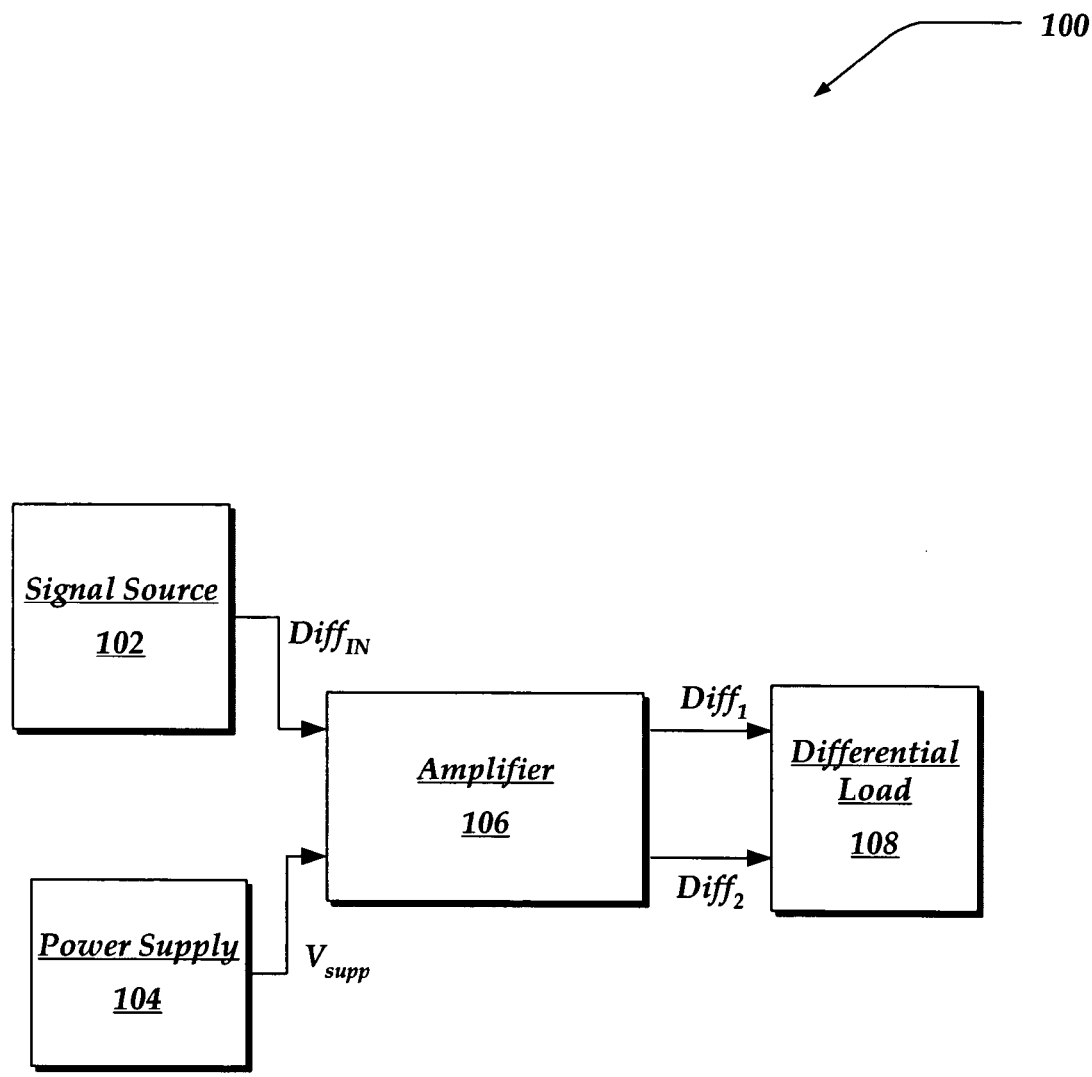
FIG. 1 is a block diagram illustrating an environment, in which one embodiment of a self-stabilizing differential load circuit according to the present invention may be implemented.

FIG. 1 illustrates block diagram 100 of an environment, in which one embodiment of a self-stabilizing differential load circuit according to the present invention may be implemented. Block diagram 100 includes signal source 102, power supply 104, amplifier 106, and differential load 108.

As mentioned previously, a balanced differential load may significantly enhance noise immunity from negative or positive power supply inputs, or from a switching event that injects equal charge into each side of the load. In a balanced differential load such noise may result in a signal common to both outputs, ideally generating no differential signal, and therefore will not be amplified by subsequent amplifier stages.

Resistive differential loads may tend to have better matching and control of impedance compared to other types of loads, but consume relatively large amount of voltage headroom due to voltage drop across the load resistors, and increase an integrated circuit area, especially if appreciable gain is desired.

Active loads, generally, comprise two transistors arranged to operate as a current source or a diode. If the transistors are used as a current source, a separate amplifier may be employed to provide common-mode feedback to bias the transistors such that they operate as a current source in steady-state mode. Aside from added circuitry and complexity, the common-mode feedback loop may also degrade a stability of the amplifier. Furthermore, an output impedance of a current source is determined by either channel length modulation (for MOSFET's) or base width modulation (for BJT's), both of which are generally difficult to control. This may lead to relatively large variations in a gain and pole locations of the amplifier.

Diode loads, generally, consume more voltage headroom than current sources, and may not provide as high impedances as resistive loads.

As illustrated in FIG. 1, signal source 102 is arranged to provide differential input signal $Diff_{IN}$ to amplifier 106. Power supply 104 is arranged to provide supply voltage $V_{supp}$ to amplifier 106. In an integrated circuit, power supply 104 may be arranged to provide supply voltage to additional circuits as well.

Amplifier 106 is a differential amplifier that is coupled to differential load 108. Amplifier 106 may include virtually any type of differential amplifier circuit known to those skilled in the art. Differential load 108 is discussed in more detail below, in conjunction with FIGS. 2 and 3.

FIG. 1 shows a particular arrangement of inputs and outputs of the various components. Other arrangements of the components may be implemented without departing from the scope and spirit of the present invention.

Figure 2:
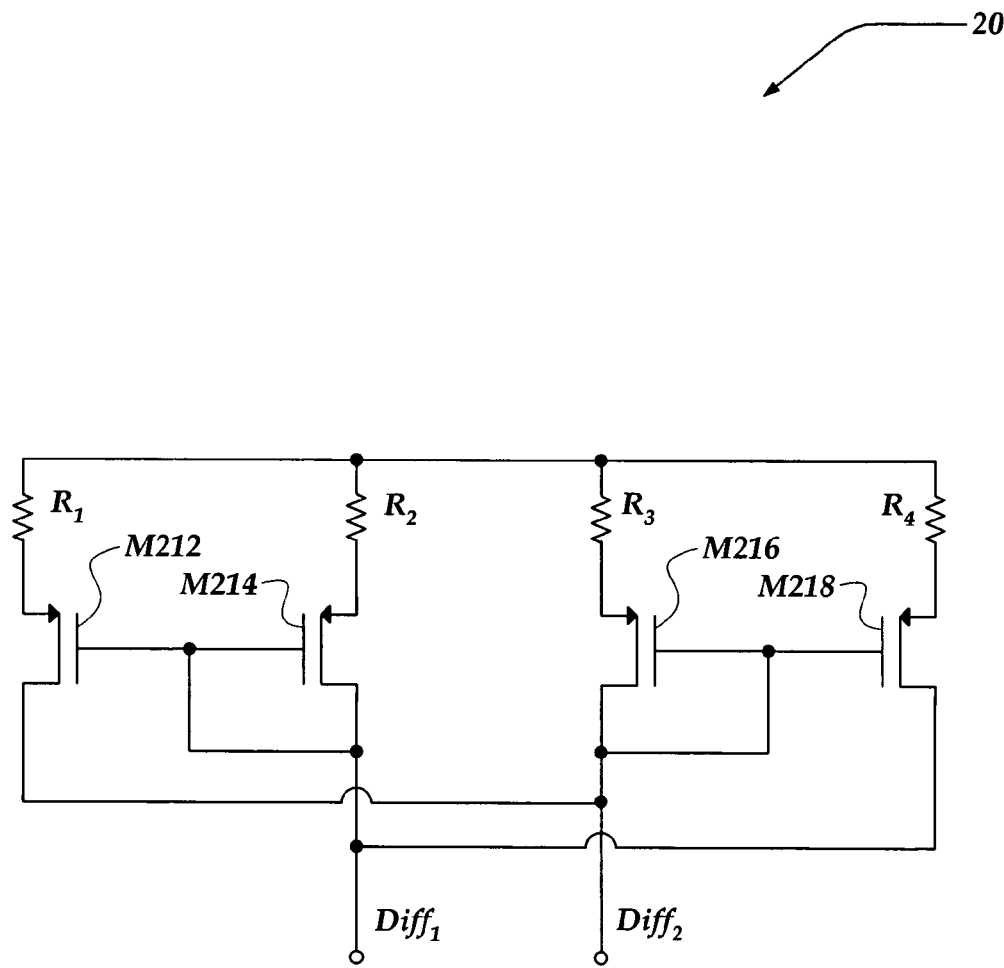
FIG. 2 schematically illustrates an embodiment of a self-stabilizing differential load circuit of FIG. 1.

FIG. 2 schematically illustrates an embodiment of self-stabilizing, differential load circuit 208. Self-stabilizing, differential load circuit 208 includes transistors M212, M214, M216, M218, and resistors $R_1$–$R_4$.

While differential load circuit 208 is shown employing MOSFET transistors and references to MOSFET technology are made throughout the specification and claims, other technologies such as Bipolar Complementary Metal Oxide Semiconductor (BiCMOS), Heterojunction Bipolar Transistor (HBT), Metal Semiconductor Field Effect Transistor (MESFET), and Bipolar Junction Transistor (BJT) may also be implemented without departing from the scope or spirit of the invention.

As illustrated in FIG. 2, PMOS transistors M212 and M214 are coupled at their gate terminals with the gate terminals also coupled to a drain terminal of M214. The drain terminal of M214 is arranged to receive one half of differential input signal $Diff_1$.

PMOS transistors M216 and M218 are coupled together in a similar manner to M212 and M214. A drain terminal of M216 is arranged to receive another half of the differential input signal $Diff_2$. A drain terminal of M212 is cross-coupled to the drain terminal of M216, and a drain terminal of M218 is cross-coupled to the drain terminal of M214.

Degeneration resistors $R_1$–$R_4$ are coupled together at one terminal. Another terminal of each degeneration resistor $R_1$–$R_4$ is coupled to a source terminal of transistors M212, M214, M216, and M218, respectively.

A degeneration resistor for a transistor is a value of resistance when an impedance seen at a drain terminal is not bypassed by an AC signal in whole or in part. If a small signal analysis of differential load circuit 208 is performed neglecting degeneration resistors and assuming transconductances of transistors are related as: $gm_1=gm_4$, and $gm_2=gm_3$, load impedance for differential load circuit 208 may be expressed as:

$$Z_{LOAD} = \frac{1}{(gm_2 - gm_1)}.$$

The relationship illustrates that by selecting values of transconductances $gm_1$ and $gm_2$ close to each other, load impedance may be made substantially large. However, transconductances may not be controlled sufficiently accurately under practical circumstances.

Figure 5:
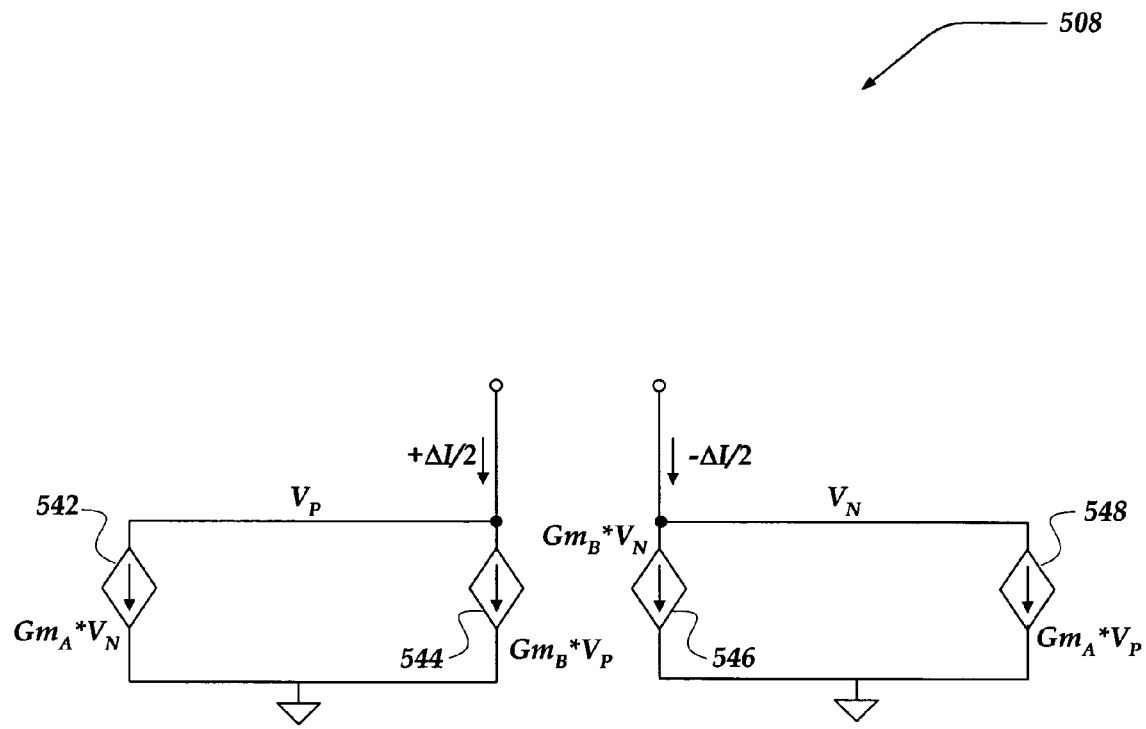
FIG. 5 schematically illustrates a small signal model of a degenerated embodiment of the self-stabilizing differential load circuit of FIG. 2 assuming infinite incremental resistance.

Accordingly, another small signal analysis of differential load circuit 208, as described in more detail in conjunction with FIG. 5, assuming infinite incremental resistance may yield the impedance for differential load circuit 208 as:

$$Z_{LOAD} \cong \frac{R_1 * R_2}{(R_1 - R_2)},$$

, also assuming $R_1=R_4$, and $R_2=R_3$. This result indicates that load impedance for differential load circuit 208 may have substantially little dependence on transconductances and incremental resistances of transistors M212–M218. A matching of the load impedance may depend substantially on a matching of resistors $R_1$–$R_4$, which may be accomplished relatively easily.

FIG. 2 shows a particular arrangement of inputs and outputs of the various components. In one embodiment, all of the components of differential load circuit 208 may be included in the same chip. Alternatively, one or more of the components may be off-chip.

Figure 3:
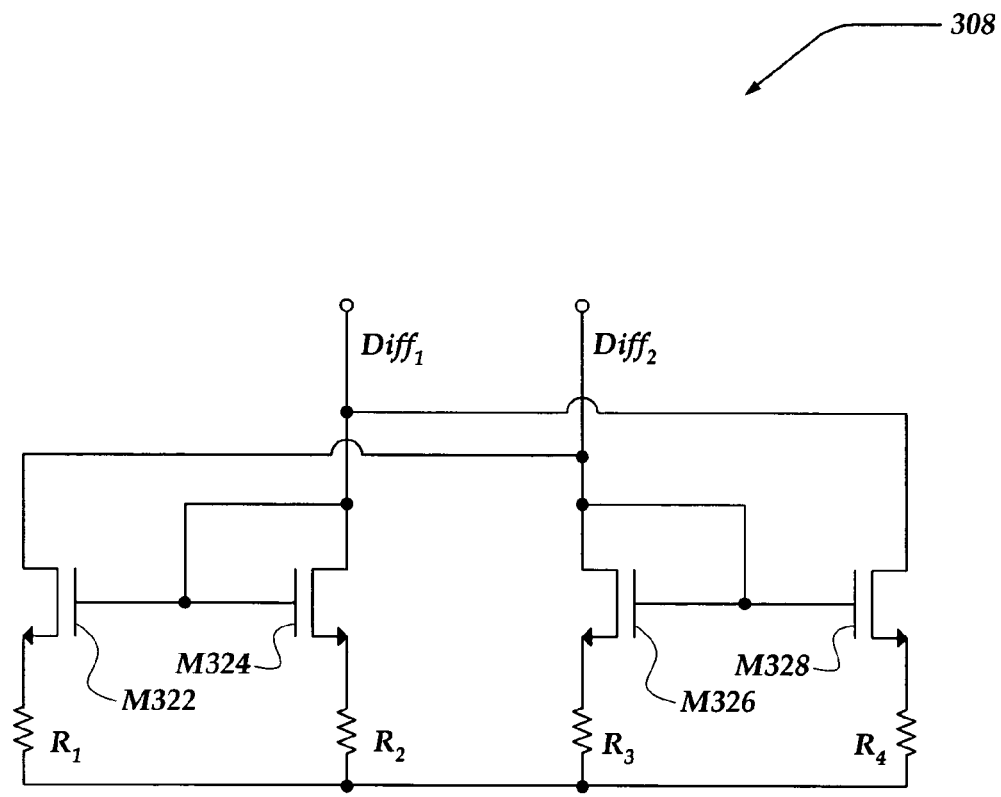
FIG. 3 schematically illustrates another embodiment of the self-stabilizing differential load circuit of FIG. 1.

FIG. 3 schematically illustrates another embodiment of self-stabilizing differential load circuit 308. Self-stabilizing differential load circuit 308 includes transistors M322, M324, M326, M328, and resistors $R_1$–$R_4$.

While differential load circuit 308 is shown employing MOSFET transistors and references to MOSFET technology are made throughout the specification and claims, other technologies such as Bipolar Complementary Metal Oxide Semiconductor (BiCMOS), Heterojunction Bipolar Transistor (HBT), Metal Semiconductor Field Effect Transistor (MESFET), and Bipolar Junction Transistor (BJT) may also be implemented without departing from the scope or spirit of the invention.

Differential load circuit 308 is an embodiment employing NMOS transistors. Transistors M322, M324, M326, M328, and resistors $R_1$–$R_4$ shown in FIG. 3 that are similarly named in FIG. 2 operate in substantially the same way as discussed above. Equations (1)–(15) discussed in conjunction with FIGS. 4 and 5 are valid for differential load circuit 308 as well, but directions of differential currents and signs of transconductances are reversed.

FIG. 3 shows a particular arrangement of inputs and outputs of the various components. In one embodiment, all of the components of differential circuit 308 may be included in the same chip. Alternatively, one or more of the components may be off-chip.

Figure 4:
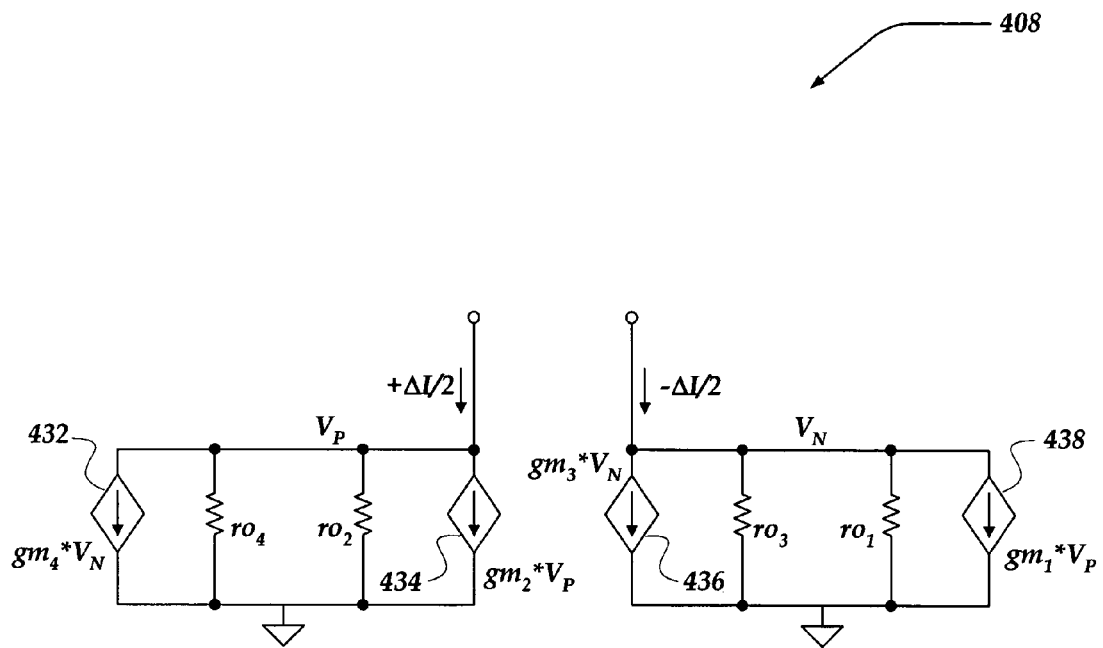
FIG. 4 schematically illustrates a small signal model of a non-degenerated embodiment of the self-stabilizing differential load circuit of FIG. 2.

FIG. 4 schematically illustrates small signal model 408 of a non-degenerated embodiment of self-stabilizing, differential load circuit 208 of FIG. 2. Small signal model 408 includes voltage controlled current sources 432, 434, 436, 438, and resistors $ro_1$–$ro_4$.

Small signal model 408 shows voltage controlled current sources 432, 434, 436, 438 representing transistors M212, M214, M216, and M218 of differential load circuit 208 of FIG. 2. Resistances in the circuit are represented by resistors $ro_1$–$ro_4$. Currents provided by current sources 432, 434, 436, 438 are $gm_4*V_N$, $gm_2*V_P$, $gm_3*V_N$, and $gm_1*V_P$, respectively. Differential input currents are represented by $\Delta I/2$ and $-\Delta I/2$.

If degeneration resistances are neglected, differential input current may be expressed as:

$$\frac{\Delta I}{2} = (gm_4 * V_N) + (gm_2 * V_P) + \left(\frac{V_P}{ro_4}\right) + \left(\frac{V_P}{ro_4}\right), \quad (1)$$

and $$-\frac{\Delta I}{2} = (gm_3 * V_N) + (gm_1 * V_P) + \left(\frac{V_N}{ro_3}\right) + \left(\frac{V_N}{ro_1}\right). \quad (2)$$

Equations (1) and (2) may be rearranged as:

$$\frac{\Delta I}{2} - (gm_4 * V_N) = V_P * \left(gm_2 + \frac{1}{ro_4} + \frac{1}{ro_2}\right), \quad (3)$$

and $$-\frac{\Delta I}{2} - (gm_1 * V_P) = V_N * \left(gm_3 + \frac{1}{ro_3} + \frac{1}{ro_1}\right). \quad (4)$$

From equations (3), and (4), voltages $V_P$ and $V_N$ may be expressed as:

$$V_P = \frac{\left(\frac{\Delta I}{2} - gm_4 * V_N\right)}{\left(gm_2 + \frac{1}{ro_4} + \frac{1}{ro_2}\right)}, \quad (5)$$

and $$V_N = \frac{\left(-\frac{\Delta I}{2} - gm_1 * V_P\right)}{\left(gm_3 + \frac{1}{ro_3} + \frac{1}{ro_1}\right)}. \quad (6)$$

If following assumptions are made:

$$gm_1 = gm_4 \text{ and } gm_3 = gm_2, \quad (7)$$

$$gm_2 \gg \frac{1}{ro_4}, \frac{1}{ro_2} \text{ and } gm_3 \gg \frac{1}{ro_3}, \frac{1}{ro_1}, \quad (8)$$

$V_P$ and $V_N$ may be expressed as:

$$V_P \cong \frac{\left(\frac{\Delta I}{2} - gm_1 * V_N\right)}{gm_2}, \quad (9)$$

$$V_N \cong \frac{\left(-\frac{\Delta I}{2} - gm_4 * V_P\right)}{gm_3} = \frac{\left(-\frac{\Delta I}{2} - gm_1 * V_P\right)}{gm_2}. \quad (10)$$

Next, $V_P$ and $V_N$ may be used in determining load impedance $Z_{LOAD}$ as:

$$Z_{LOAD} = \frac{V_P - V_N}{\Delta I} = \frac{1}{\Delta I}\left(\frac{\Delta I + gm_1 * (V_P - V_N)}{gm_2}\right) = \frac{1}{(gm_2 - gm_1)}. \quad (11)$$

As equation (11) illustrates, an approximation of the load impedance based on assumptions (7) and (8), result in determination of the load impedance based on a difference between transconductances of transistors M212 and M216, or transistors M214 and M218 only. Accordingly, a value of the load impedance may be made substantially large by selecting transconductances $gm_1$ and $gm_2$, or $gm_3$ and $gm_4$ substantially equal. As mentioned before, however, transconductances are, generaly, not easy to control, and an analysis of the differential load circuit with degenerated transistors may provide more practical results, where the impedance is dependent on degeneration resistors.

FIG. 5 schematically illustrates small signal model 508 of a degenerated embodiment of self-stabilizing, differential load circuit 208 of FIG. 2 assuming infinite incremental resistance. Small signal model 508 includes voltage controlled current sources 542, 544, 546, and 548.

Small signal model 508 shows voltage controlled current sources 542, 544, 546, and 548 representing transistors M212, M214, M216, and M218 of differential load circuit 208 of FIG. 2. Incremental resistances in the circuit are assumed to be infinite. Currents provided by current sources 542, 544, 546, and 548 are $Gm_A*V_N$, $Gm_B*V_P$, $Gm_B*V_N$, and $Gm_A*V_P$, respectively. Differential input currents are again represented by $\Delta I/2$ and $-\Delta I/2$.

Load impedance $Z_{LOAD}$ my be expressed as:

$$Z_{LOAD} = \frac{V_P - V_N}{\Delta I} = \frac{1}{\Delta I}\left(\frac{\Delta I + Gm_A * (V_P - V_N)}{Gm_B}\right) = \frac{1}{(Gm_B - Gm_A)}. \quad (12)$$

Transconductances $Gm_A$ and $Gm_B$ may be expressed as a function of transistor transconductances $gm_1$, $gm_2$, and resistors $R_1$, $R_2$:

$$Gm_A = \frac{gm_1}{(1 + gm_1 * R_1)} \cong \frac{1}{R_1}, \quad (13)$$

if $(gm_1*R_1) \gg 1$, and $$Gm_B = \frac{gm_2}{(1 + gm_2 * R_2)} \cong \frac{1}{R_2}, \quad (14)$$

if $(gm_2*R_2) \gg 1$.

From equations (13) and (14) follows an approximation of $Z_{LOAD}$ as:

$$Z_{LOAD} \cong \frac{R_1 * R_2}{(R_1 - R_2)}, \quad \text{if } R_1 = R_4, R_2 = R_3. \qquad (15)$$

The above analysis indicates that load impedance of differential load circuit 208 depends substantially on degeneration resistors and substantially little on transconductances and incremental resistances of the transistors. Accordingly, transistor mismatch and channel length (base width) modulation may have a negligible effect on $Z_{LOAD}$. Therefore, a matching of the differential load circuit may depend substantially on a matching of resistors $R_1$–$R_4$. Commonly available technologies are capable of producing better than 1% matching resistors. Consequently, well controlled load circuits according to one embodiment of the present invention are feasible.

A magnitude of the load impedance may be increased by selecting a value of $R_1$ and a value of $R_2$ substantially close to each other. If a difference between resistances of $R_1$ and $R_2$ is selected sufficiently small, impedances similar to current sources may be obtained without employing common mode feedback loops. As a result of employing cross-coupled transistors, low voltage headroom of differential load circuit 208 may approximate that of a dual diode load.

Figure 6:
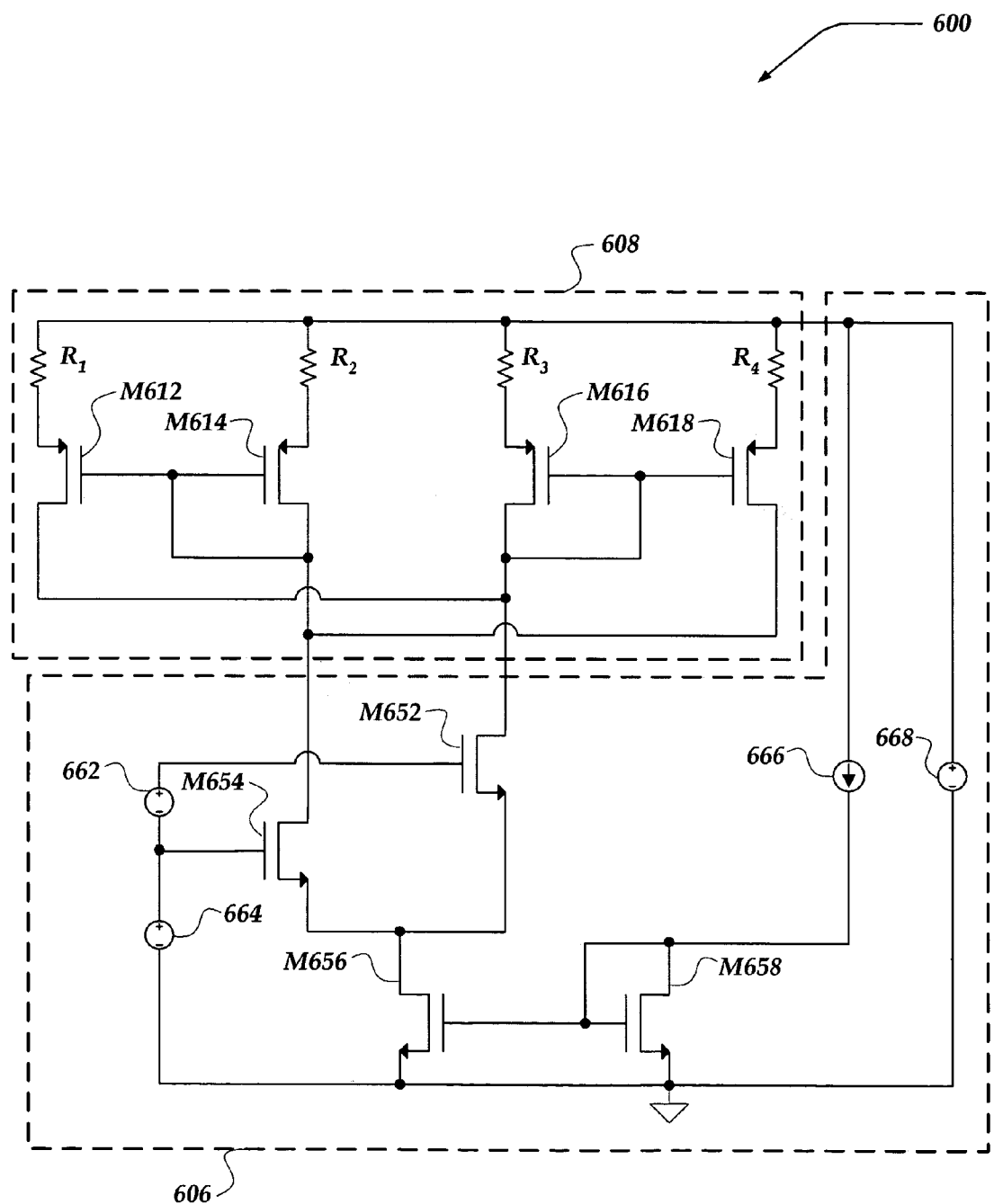
FIG. 6 schematically illustrates one embodiment of an amplifier employing the self-stabilizing differential load circuit of FIG. 2.

FIG. 6 schematically illustrates one embodiment of amplifier 600 employing self-stabilizing differential load circuit 208 of FIG. 2. Amplifier 600 includes self-stabilizing differential load circuit 608 and amplifying circuit 606. Self-stabilizing differential load circuit 208 includes transistors M612, M614, M616, M618, and resistors $R_1$–$R_4$. Amplifying circuit 606 includes transistors M652, M654, M656, M658, voltage sources 662, 664, 668, and current source 666.

Amplifying circuit 606 is an exemplary differential amplifier circuit with transistors M652 and M654 arranged to operate as a differential amplifier pair. Transistors M656 and M658 are arranged to operate as a current source coupled to the drains of M652 and M654. Current source 666 is arranged to provide a current to M658, which is mirrored as a bias current to the drains of the differential amplifier pair.

Voltage source 668 provides a supply voltage to differential load circuit 608. Voltage sources 662 and 664 represent sources for the signals to be amplified and may reside outside amplifier 600 in one embodiment.

Differential load circuit 608 includes transistors and resistors that are similarly named in FIG. 2, and operate in substantially the same way as discussed previously. Input nodes of differential load circuit 608 are coupled to source terminals of differential amplifier input pair M652 and M654.

Differential load circuit 608 provides amplifying circuit 606 a self-stabilizing, balanced load.

The above specification, examples and data provide a description of the manufacture and use of the composition of the invention. Since many embodiments of the invention can be made without departing from the spirit and scope of the invention, the invention also resides in the claims hereinafter appended.

I claim:

1. A differential load circuit for a differential amplifier, the load circuit comprising:
a first transistor and a second transistor that are configured such that:
a gate terminal of the first transistor and a gate terminal of the second transistor are coupled together;
a drain of the second transistor is arranged to receive a first half of a differential signal, and is coupled to the gate terminals of the first and the second transistors;
a third transistor and a fourth transistor that are configured such that:
a gate terminal of the third transistor and a gate terminal of the fourth transistor are coupled together;
a drain of the third transistor is coupled to the gate terminals of the third and the fourth transistors and to the drain of the first transistor; and
a drain of the fourth transistor is coupled to the drain of the second transistor; and
a first, a second, a third, and a fourth resistors, wherein a terminal of each of the resistors is coupled together, and wherein another terminal of each of the resistors is coupled to a source terminal of each of the first, second, third, and fourth transistors.

2. The circuit of claim 1, wherein the first, second, third, and fourth transistors comprise PMOS transistors.

3. The circuit of claim 2, wherein a load impedance of the load circuit is substantially equal to a product of resistances of the first and the second resistors divided by a difference of the resistances of the first and the second resistors, if incremental resistances of the transistors are substantially large, a product of a transconductance of the first transistor and the resistance of the first resistor is substantially larger than one, a product of a transconductance of the second transistor and the resistance of the second resistor is substantially larger than one, the resistance of the first resistor and the resistance of the fourth resistor are substantially equal, and the resistance of the second resistor and the resistance of the third resistor are substantially equal.

4. The circuit of claim 3, wherein a difference between resistances of the first resistor and the second resistor is pre-selected sufficiently small such that an impedance of the differential load circuit is substantially equal to an impedance of a current source.

5. The circuit of claim 2, wherein resistances of the first, second, third, and fourth resistors are pre-selected sufficiently large such that an impedance of the differential load circuit is substantially large.

6. The circuit of claim 2, wherein resistances of the first, second, third, and fourth resistors are pre-selected to match within about one percent.

7. The circuit of claim 1, wherein the first, second, third, and fourth transistors comprise NMOS transistors.

8. A method for providing a differential load to a differential amplifier, the method comprising:
receiving a first half and a second half of a differential input signal;
providing the first half of the differential input signal to a drain terminal of a first transistor and a drain terminal of a third transistor, wherein a source terminal of the first transistor and a source terminal of the third transistor are coupled together through a first resistor and a third resistor that are serially coupled; and
providing the second half of the differential input signal to a drain terminal of a second transistor and a drain terminal of a fourth transistor, wherein a source terminal of the second transistor and a source terminal of the fourth transistor are coupled together through a second resistor and a fourth resistor that are serially coupled.

9. The method of claim 8, further comprising:
coupling gate terminals of the first transistor and the second transistor together;
coupling gate terminals of the third transistor and the fourth transistor together;

coupling gate terminals of the first transistor and the second transistor to the drain terminal of the second transistor; and coupling gate terminals of the third transistor and the fourth transistor to the drain terminal of the third transistor.

10. The method of claim 9, further comprising:

pre-selecting the transistors and the resistors such that:
incremental resistances of the transistors are substantially large;
a product of a transconductance of the first transistor and a resistance of the first resistor is substantially larger than one;
a product of a transconductance of the second transistor and a resistance of the second resistor is substantially larger than one;
the resistance of the first resistor and a resistance of the fourth resistor are substantially equal; and
the resistance of the second resistor and a resistance of the third resistor are substantially equal.

11. The method of claim 10, wherein a load impedance of the load circuit that is encountered by the differential input signal is substantially equal to a product of the resistances of the first and the second resistors divided by a difference of the resistances of the first and the second resistors.

12. The method of claim 10, further comprising:

pre-selecting resistances of the first resistor and the second resistor such that the resistances match substantially.

13. The method of claim 9, further comprising:

pre-selecting resistances of the first, second, third, and fourth resistors sufficiently small such that an impedance of the differential load circuit is substantially equal to an impedance of a current source.

14. The method of claim 9, wherein the first, second, third, and fourth transistors are at least one of a PMOS and an NMOS transistor.

15. A differential amplifier device including a differential load circuit, the device comprising:

a differential amplifier circuit including at least one amplifying stage comprising a first amplifying transistor, a second amplifying transistor, and a biasing source; and a differential load circuit that includes two cross-coupled load transistor pairs and at least one degeneration resistor for each transistor, wherein a load impedance of the differential load circuit is substantially equal to a product of resistances of a first degeneration resistor and a second degeneration resistor divided by a difference between the resistances of the first degeneration resistor and the second degeneration resistor.

16. The device of claim 15, wherein the differential load circuit is configured such that:

a gate terminal of a first load transistor and a gate terminal of a second load transistor are coupled together;
a drain terminal of the second load transistor is coupled to the gate terminals of the first and the second load transistors, and to a drain terminal of the first amplifying transistor;
a gate terminal of a third load transistor and a gate terminal of a fourth load transistor are coupled together;
a drain terminal of the third load transistor is coupled to the gate terminals of the third and the fourth load transistors, the drain terminal of the first load transistor, and a drain terminal of the second amplifying transistor; and
a drain terminal of the fourth load transistor is coupled to the drain terminal of the second load transistor.

17. The device of claim 16, wherein the differential load circuit is further configured such that:

a terminal of each of the degeneration resistors is coupled together; and
another terminal of each of the degeneration resistors is coupled to a source terminal of each of the first, second, third, and fourth load transistors.

18. The device of claim 16, wherein the load transistors and the amplifying transistors include at least one of a Metal Oxide Field Effect Transistor (MOSFET), a Bipolar Complementary Metal Oxide Semiconductor (BiCMOS), a Heterojunction Bipolar Transistor (HBT), a Metal Semiconductor Field Effect Transistor (MESFET), and a Bipolar Junction Transistor (BJT).

19. The device of claim 16, wherein the load transistors include at least one of a PMOS transistor and an NMOS transistor.

20. The device of claim 16, wherein the resistances of the first degeneration resistor and a third degeneration resistor that are coupled to the first load transistor and the third load transistor, respectively, are substantially equal, and wherein the resistances of the second degeneration resistor and a fourth degeneration resistor that are coupled to the second load transistor and the fourth load transistor, respectively, are substantially equal.

* * * * *

UNITED STATES PATENT AND TRADEMARK OFFICE
CERTIFICATE OF CORRECTION

PATENT NO. : 7,019,590 B1  
APPLICATION NO. : 10/944930  
DATED : March 28, 2006  
INVENTOR(S) : David J. Megaw Page 1 of 1

It is certified that error appears in the above-identified patent and that said Letters Patent is hereby corrected as shown below:

In the Specification:

Column 5, Line 1, Delete " $\left(\dfrac{V_P}{rO_4}\right) + \left(\dfrac{V_P}{rO_4}\right),$ " and insert -- $\left(\dfrac{V_P}{rO_4}\right) + \left(\dfrac{V_P}{rO_2}\right),$ --.

Signed and Sealed this

Tenth Day of October, 2006

JON W. DUDAS  
*Director of the United States Patent and Trademark Office*